United States Patent [19]

Higuchi et al.

[11] Patent Number: 4,709,165
[45] Date of Patent: Nov. 24, 1987

[54] VOLTAGE SUPPLY LEVEL DETECTING CIRCUIT

[75] Inventors: Mitsuo Higuchi, Tokyo; Manabu Tsuchida, Yokohama, both of Japan

[73] Assignee: Fujitsu Limited, Kawasaki, Japan

[21] Appl. No.: 946,173

[22] Filed: Dec. 24, 1986

Related U.S. Application Data

[63] Continuation of Ser. No. 841,051, Mar. 17, 1986, abandoned, which is a continuation of Ser. No. 490,185, Apr. 29, 1983, abandoned.

[30] Foreign Application Priority Data

Apr. 30, 1982 [JP] Japan ............................. 57-72912

[51] Int. Cl.$^4$ ............................................. H03K 5/153
[52] U.S. Cl. .................................... 307/350; 307/362; 307/296 R
[58] Field of Search ............... 307/354, 350, 362, 363, 307/296 R, 296 A

[56] References Cited

U.S. PATENT DOCUMENTS 4,270,190  5/1981  Jindra et al. .
4,348,596  9/1982  Atherton et al. ................. 307/264

FOREIGN PATENT DOCUMENTS 2659221   7/1977  Fed. Rep. of Germany .
55-149871 11/1980  Japan .

OTHER PUBLICATIONS

Der Elektroniker, Nr. 11, 1974, Biship, Jones "C-MOS, ein Bericht uber den heutigen Stand", pp. E1 11-E1 17.
Franzis, das Kleine Praktikum, Franzis-Verlag, 1977, Munchen Pelka "Schaltungen und Bausteine der Elektronik", p. 27; FIG. 2.1.2.
Der Elektroniker, Nr. 16, 1981 Auderer "CMOS-Technologie—Basis für die Zukunft", FIG. 3b.

Primary Examiner—John Zazworsky
Attorney, Agent, or Firm—Staas & Halsey

[57] ABSTRACT

A voltage supply level detecting circuit comprising a P-channel MIS transistor and an N-channel MIS transistor, the P-channel and N-channel MIS transistors being connected in series between the variable voltage supply and ground, and the gates of the P-channel and N-channel MIS transistors being connected to a fixed voltage supply.

6 Claims, 7 Drawing Figures

VOLTAGE SUPPLY LEVEL DETECTING CIRCUIT

This is a continuation of application Ser. No. 841,051, filed on Mar. 17, 1986, now abandoned, which is a continuation of co-pending application Ser. No. 490,185, filed on Apr. 29, 1983, now abandoned.

BACKGROUND OF THE INVENTION

Field of the Invention

The present invention relates to a voltage supply level detecting circuit, and more particularly, to a voltage supply level detecting circuit for detecting whether the voltage applied to a semiconductor memory device is high or low.

Description of the Prior Art

In some semiconductor memory devices, for example, an erasable programmable read only memory device (EPROM), two voltages are supplied to the circuit, i.e., a fixed voltage supply $V_{CC}$ (5 V) and a variable voltage supply $V_{PP}$ set to a high voltage level (21 V) when programming and at a low voltage level (5 V) when reading. In such a device, a detecting circuit detects whether the variable voltage supply is at the high or low voltage level. The output of the detecting circuit sets the operation of the memory device to the programming or reading mode.

There is a known a prior art $V_{PP}$ level detecting circuit which comprises a first depletion type N-channel transistor, a first enhancement type N-channel transistor, a second depletion type N-channel transistor, a second enhancement type N-channel transistor, a third depletion type N-channel transistor, and a third enhancement type N-channel transistor. The first depletion type transistor and the first enhancement type transistor are connected in series between the fixed voltage supply $V_{CC}$ and ground. The gate of the firs depletion type transistor is connected to its source, and the gate of the first enhancement type transistor is connected to the variable voltage supply $V_{PP}$. The second depletion type transistor and the second enhancement type transistor are connected in series between the fixed voltage supply and ground. The gate of the second depletion type transistor is connected to its source, and the gate of the second enhancement type transistor is connected to the junction between the first depletion type transistor and the first enhancement type transistor. The third depletion type transistor and the third enhancement type transistor are connected in series between the fixed voltage supply $V_{CC}$ and ground. The gate of the third depletion type transistor is connected to its source, and the gate of the third enhancement type transistor is connected to the junction between the second depletion type transistor and the second enhancement type transistor.

In this prior art detecting circuit, the conductivity gm of the first enhancement transistor is designed to be small relative to the conductance gm of the first depletion transistor, so that when the variable voltage supply $V_{PP}$ is at the low level (5 V) the first enhancement transistor cannot be turned on fully and so that when the variable voltage supply $V_{PP}$ is at a high level (21 V), the first enhancement type transistor is fully turned on. Thus, the level of the junction between the first depletion type transistor and the first enhancement type transistor is at a relatively "high" level when the variable voltage supply $V_{PP}$ is a low level (5 V). Thus, the second enhancement type transistor is turned on, the third enhancement type transistor is turned off, and, the output level has a "high" level. On the other hand, when the variable voltage supply $V_{PP}$ is at a high level (21 V), the level of the junction between the first depletion type transistor and the first enhancement type transistor is at a relatively "low" level. Thus, the second enhancement type transistor is turned off, the third enhancement type transistor is turned on, and the output level has a "low" level.

In the above-mentioned prior art voltage supply level detecting circuit, the ratio of the dimensions of the first depletion type transistor and the first enhancement type transistor must be selected to be a predetermined value. Therefore, the construction of the circuit is difficult, and it is difficult to achieve stable circuit operation.

To counter these problems, there has been proposed another prior art voltage supply level detecting circuit, in which the second depletion type transistor in the above-mentioned circuit, connected between the fixed voltage supply and the second enhancement type transistor, is replaced by a group of enhancement type N-channel transistors, the gate of each is connected to its drain and the group is connected in series between the variable voltage supply and the second enhancement type transistor.

In this circuit, the sum of the threshold values of the group of the enhancement type transistors is selected to be more than the low voltage supply level (5 V). When the variable voltage supply is a low level (5 V), the first enhancement type transistor is turned on, but not fully, and the level of the junction between the first depletion type transistor and the first enhancement type transistor is relatively "high", so that the second enhancement type transistor is turned on. Since the voltage across the group of series-connected enhancement type transistors is lower than 5 V, at least one of these transistors is off. Thus, the level of the drain of the second enhancement type transistor has a low level. Thus, the third enhancement type transistor is returned off and the output has a "high" level.

On the other hand, when the variable voltage supply $V_{PP}$ is a high level (21 V), the first enhancement type transistor is fully turned on, the level of its drain has a "low" level, and the second enhancement type transistor is turned off. Thus, the level of the drain of the second enhancement type transistor has a "high" level, which level is lower than the high level of $V_{PP}$ by the sum of the threshold voltages of the group of the series-connected enhancement type transistors. Thus, the third enhancement type transistor is turned on, and the output has a "low" level.

In this prior art detecting circuit, at least one of the series-connected transistors is turned off when the variable voltage supply $V_{PP}$ is a low level, the second enhancement type transistor is not necessarily fully turned on. Accordingly, the dimension ratio of the first depletion type transistor and the first enhancement type transistor is not as critical as in the first mentioned prior art detecting circuit. However, in this second prior art detecting circuit, a large number of series-connected transistors are required in order to increase the sum of the threshold voltages of these transistors, and decrease the gate voltage of the third enhancement type transistor. Consequently, the number of components of this circuit is large.

SUMMARY OF THE INVENTION

An object of the present invention is to provide a voltage supply level detecting circuit which has a small number of elements, by using a complementary metal-insulator semiconductor (CMIS) circuit, and which has a stable operation characteristic.

In accordance with the present invention, there is provided a voltage supply level detecting circuit, comprising; a first voltage supply terminal receiving a fixed voltage level; a second voltage supply terminal receiving a variable voltage level being set at a high voltage level or low voltage level; a ground terminal; a first MIS transistor of one conductivity type; and a second MIS transistor of an opposite conductivity type. The first and second MIS transistors are connected in series between the second voltage supply terminal and the ground terminal. The gates of the first and second MIS transistors are both connected to the first voltage supply terminal. The level of the junction between the first and second MIS transistors is used for detecting whether the high voltage level or the low voltage level is applied to the second voltage supply terminal.

DESCRIPTION OF THE PREFERRED EMBODIMENTS

Figure 1:
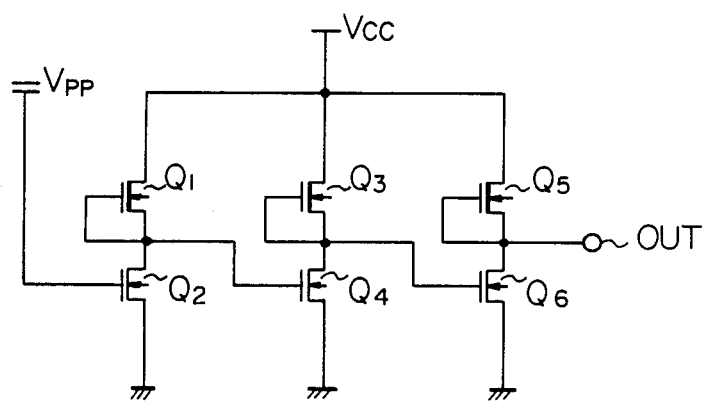
FIG. 1 is a circuit diagram of one prior art voltage supply level detecting circuit.

Before describing the preferred embodiments, the foregoing prior art voltage supply level detecting circuits are described in accordance with the drawings. FIG. 1 is a circuit diagram of the first prior art voltage supply level detecting circuit. The circuit of FIG. 1 comprises N-channel MIS transistors $Q_1$ though $Q_6$. The transistors $Q_1$, $Q_3$, $Q_5$ are depletion type transistors, and the transistors $Q_2$, $Q_4$, $Q_6$ are enhancement type transistors. The transistors $Q_1$ and $Q_2$ are connected in series between the fixed voltage supply $V_{CC}$ and ground. The gate of the transistor $Q_1$ is connected to its source, and the gate of the transistor $Q_2$ is connected to the variable voltage supply $V_{PP}$. The transistors $Q_3$ and $Q_4$ are connected in series between the fixed voltage supply $V_{CC}$ and ground. The gate of the transistor $Q_3$ is connected to its source, and the gate of the transistor $Q_4$ is connected to the junction of the transistors $Q_1$ and $Q_2$. The transistors $Q_5$ and $Q_6$ are connected in series between the fixed voltage supply $V_{CC}$ and ground. The gate of the transistor $Q_5$ is connected to its source, and the gate of the transistor $Q_6$ is connected to the junction of the transistor $Q_3$ and $Q_4$. In the voltage supply level detecting circuit of FIG. 1, when the variable voltage supply $V_{PP}$ is at a low level (5 V), the output OUT has a high level. When the variable voltage supply $V_{PP}$ is at a high level (21 V), the output OUT has a low level. However, as described above, it is difficult to form transistors $Q_1$ and $Q_2$ with the desired ratio of dimensions.

Figure 2:
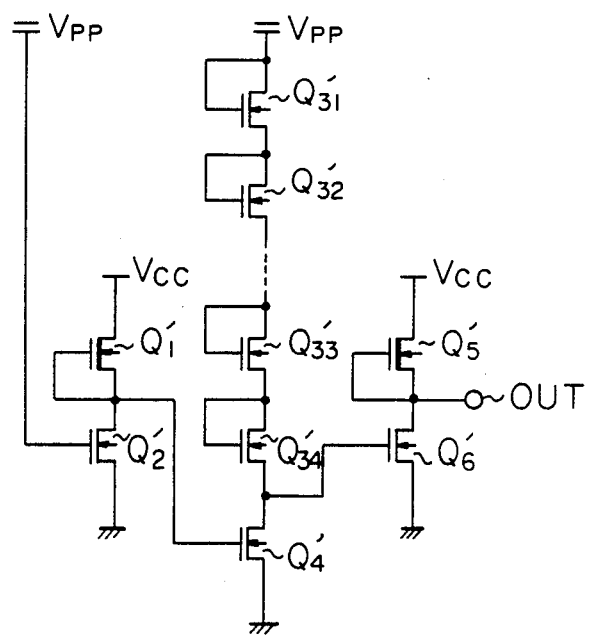
FIG. 2 is a circuit diagram of another prior art voltage supply level detecting circuit.

FIG. 2 is a circuit diagram of the second prior art voltage supply level detecting circuit. The voltage supply level detecting circuit of FIG. 2 comprises N-channel MIS transistors $Q_1'$, $Q_2'$, $Q_{31}'$, $Q_{32}'$, - - -, $Q_{33}'$, $Q_{34}'$, $Q_4'$, $Q_5'$, and $Q_6'$. The construction of the detecting circuit of FIG. 2 is the same as that of the detecting circuit of FIG. 1, except that a group of series connected enhancement type transistors are connected between the variable voltage supply $V_{PP}$ and the enhancement type transistor $Q_4'$. In the voltage supply level detecting circuit of FIG. 2, the sum of the threshold voltages of the transistors $Q_{31}'$, $Q_{32}'$, - - -, $Q_{33}'$, and $Q_{34}'$ is greater than the low level (5 V) of the variable voltage supply $V_{PP}$. Thus, when the variable voltage supply $V_{pp}$ is at a low level (5 V), at least one of these transistors $Q_{31}'$, $Q_{32}'$, - - -, $Q_{33}'$ and $Q_{34}'$ is turned off. Accordingly, even if the transistor $Q_4'$ is not fully turned on, the level of the gate of the transistor $Q_6'$ has a low level and the transistor $Q_6'$ is turned off. Thus, the output OUT has a "high" level. When the variable voltage supply $V_{PP}$ is at a high level (21 V), the transistor $Q_2'$ turned fully on, the gate voltage of the transistor $Q_4'$ has a "low" level, and the transistor $Q_4'$ is turned off. Accordingly, the gate voltage of the transistor $Q_6'$ has a "high" level (lower than the level of $V_{PP}$ by the sum of the threshold voltages of transistors $Q_{31}'$, $Q_{32}'$, - - -, $Q_{33}'$ and $Q_{34}'$), transistor $Q_6'$ is turned on, and the output OUT becomes a "low" level. In the voltage supply level detecting circuit of FIG. 2, the numvber of required elements is large. The circuit of FIG. 2 is disclosed in Japanese Patent Application No. 53-93501 (1978).

Figure 3:
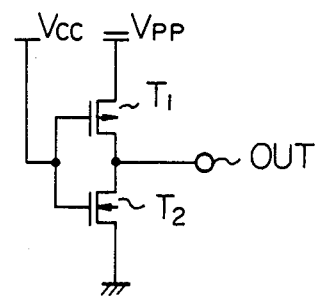
FIG. 3 is a circuit diagram of a voltage supply level detecting circuit in accordance with a first embodiment of the present invention.

A voltage supply level detecting circuit in accordance with a first embodiment of the present invention is illustrated in FIG. 3. The voltage supply level detecting circuit of FIG. 3 is a basic embodiment of the present invention and comprises enhancement type MIS transistors $T_1$ and $T_2$. The transistor $T_1$ is a P-channel and the transistor $T_2$ is an N-channel. The transistors $T_1$ and $T_2$ are connected in series between the variable voltage supply $V_{PP}$ and ground. The gates of the transistors $T_1$ and $T_2$ are both connected to the fixed voltage supply $V_{CC}$. The junction of the transistors $T_1$ and $T_2$ is connected to the output OUT. These transistors $T_1$ and $T_2$ form a CMIS circuit.

When the variable voltage supply is at a low level, that is, $V_{PP}=V_{CC}=5$ V, the transistor $T_1$ is turned off because the gate-source voltage of the transistor $T_1$ is 0 V, and the transistor $T_2$ is turned on because the gate-source voltage of the transistor $T_2$ is more than the threshold voltage. Thus, the output OUT has a low level. When the variable voltage supply $V_{PP}$ is at a high level, that is, $V_{PP}=21$ V, the transistors $T_1$ and $T_2$ are both turned on, because the gate-source voltage of the transistor $T_1$, that is $(V_{PP}-V_{CC})$, is greater than the threshold voltage $V_{THP}$ of the transistor $T_1$. In this case, the level of the output OUT is determined by the ratio of the conductance gm of the transistors $T_1$ and $T_2$. Thus, by selecting this ratio to a proper value, the output OUT will have a "high" level. As described above, in accordance with the voltage supply level detecting circuit of FIG. 3, it can be readily detected whether the variable voltage supply $V_{PP}$ is higher than $(V_{CC}+V_{THP})$ or not.

Figure 4:
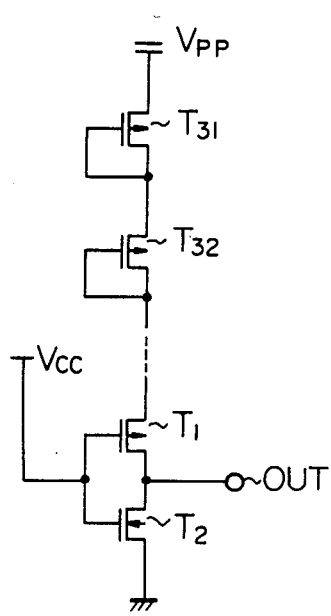
FIG. 4 is a circuit diagram of a voltage supply level detecting circuit in accordance with a second embodiment of the present invention.

A voltage supply level detecting circuit in accordance with a second embodiment of the present invention is illustrated in FIG. 4. The voltage supply level detecting circuit of FIG. 4 comprises a P-channel transistor $T_1$, an N-channel transistor $T_2$, a plurality of P-channel transistors $T_{31}$, $T_{32}$, and so on. The construction of the voltage supply level detecting circuit of FIG. 4 is the same as that of the circuit of FIG. 3, except that the transistors $T_{31}$, $T_{32}$, - - - are connected in series between the variable voltage supply $V_{PP}$ and the P-channel transistor $T_1$. The gate of each of these series-connected transistors $T_{31}$, $T_{32}$, - - - is connected to its drain. The number n of these series-connected transistors $T_{31}$, $T_{32}$, - - - is selected to be in the range fulfilling the following condition:

$$V_{PP}(\text{high voltage}) - n \cdot |V_{THP}| > V_{CC} + |V_{THP}|$$

In the voltage supply level detecting circuit of FIG. 4, when the variable voltage supply is at a low level, that is, $V_{PP}=V_{CC}=5$ V, the transistor $T_1$ is turned off, the transistor $T_2$ is turned on, and the output OUT has a "low" level. On the other hand, when the variable voltage supply $V_{PP}$ is at a high level, that is, $V_{PP}=21$ V, the transistors $T_1$ and $T_2$ are turned on and all of the transistors $T_{31}$, $T_{32}$, - - - also are turned on. Thus, the output OUT has a "high" level. This "high" level is determined by the ratio of transistor conductance gm between the transistor $T_2$ and the other transistors $T_1$, $T_{31}$, $T_{32}$, - - - . In this case, the "high" level of the output OUT can be readily decreased to a proper level, so that the output OUT can be connected directly to a gate of a next stage transistor with low breakdown voltage. For example, assuming that only two transistors $T_{31}$ and $T_{32}$ are inserted between the variable voltage supply $V_{PP}$ and the source of the transistor $T_1$ and that the conductances gm of all the transistors $T_1$, $T_2$, $T_{31}$, and $T_{32}$ are the same, the output OUT becomes 5.25 V (=21 V/4).

Comparing the detecting circuit of FIG. 4 with the prior art detecting circuit of FIG. 2, the number of the series-connected transistors $T_{31}$, $T_{32}$, - - - , and $T_1$ required in FIG. 4 is less than the number of the series-connected transistors $Q_{31}'$, $Q_{32}'$, - - - , $Q_{33}'$, and $Q_{34}'$, required in FIG. 2, since the source-drain voltage $V_{SD}$ is used in the circuit of FIG. 4 instead of the threshold voltage $V_{TH}$ to decrease the "high" level of the output to a proper level.

Figure 5:
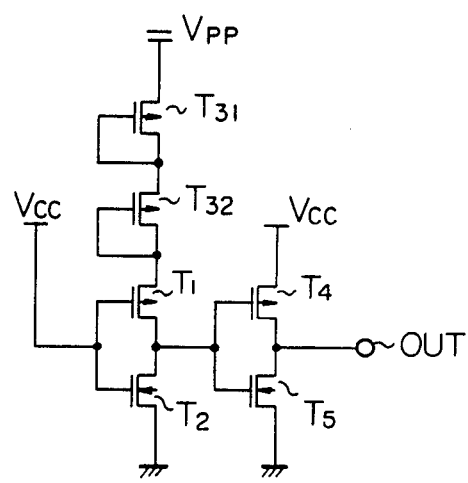
FIG. 5 is a circuit diagram of a voltage supply level detecting circuit in accordance with a third embodiment of the present invention.

A voltage supply level detecting circuit in accordance with a third embodiment of the present invention is illustrated in FIG. 5. The voltage supply level detecting circuit of FIG. 5 comprises P-channel MIS transistors $T_1$, $T_{31}$, and $T_{32}$ and an N-channel MIS transistor $T_2$ connected as in the circuit of FIG. 4. It further comprises a P-channel MIS transistor $T_4$ and an N-channel MIS transistor $T_5$. The transistors $T_4$ and $T_5$ are connected in series between the fixed voltage supply $V_{CC}$ and ground. The gates of the transistors $T_4$ and $T_5$ are both connected to the junction of the transistors $T_1$ and $T_2$. The junction of the transistors $T_4$ and $T_5$ is connected to the output terminal OUT. The transistors $T_4$ and $T_5$ construct a CMIS inverter circuit. Thus, in the voltage supply level detecting circuit of FIG. 5, when the variable voltage supply $V_{PP}$ is at a low level (5 V), the output OUT has a "high" level. When the variable voltage supply $V_{PP}$ is at a high level (21 V), the output OUT has a "low" level. The transistors $T_{31}$ and $T_{32}$ may be replaced by N-channel transistors.

The voltage supply level detecting circuit of FIGS. 3, 4 or 5, may be used in an EPROM. Generally, in an EPROM, various operation modes exist in the programming operation and in the reading operation. These operation modes may be changed by external control signals $\overline{CE}$, $\overline{OE}$, and $\overline{PGM}$ and by the level of the variable voltage supply $V_{PP}$. The relation between the selected operation mode and the condition of the external control signals is shown in the following table.

TABLE

| Operation modes | | Control signals | | | |
| --- | --- | --- | --- | --- | --- |
| | | $\overline{CE}$ | $\overline{OE}$ | $\overline{PGM}$ | $V_{PP}$ |
| Reading operation | Read | "L" | "L" | "H" | Low (5 V) |
| | Stand-by | "H" | — | — | Low (5 V) |
| | Output disable | "L" | "H" | — | Low (5 V) |
| Programming operation | Program | "L" | — | "L" | High (21 V) |
| | Verify | "L" | "L" | "H" | High (21 V) |
| | Inhibit | "H" | — | — | High (21 V) |

Thus, it is necessary to detect whether the variable voltage supply $V_{PP}$ is at a high level or a low level in the EPROM. In particular, the program mode in the programming operation can be discriminated from the output disable mode in the reading operation by the level of the variable voltage supply $V_{PP}$.

Figure 6:
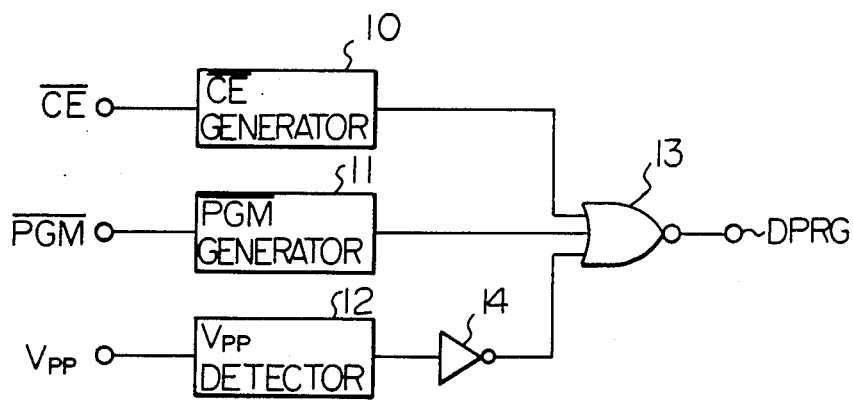
FIGS. 6 and 7 are circuit diagrams of an EPROM in which the voltage supply level detecting circuit of FIG. 5 is applied.
Figure 7:
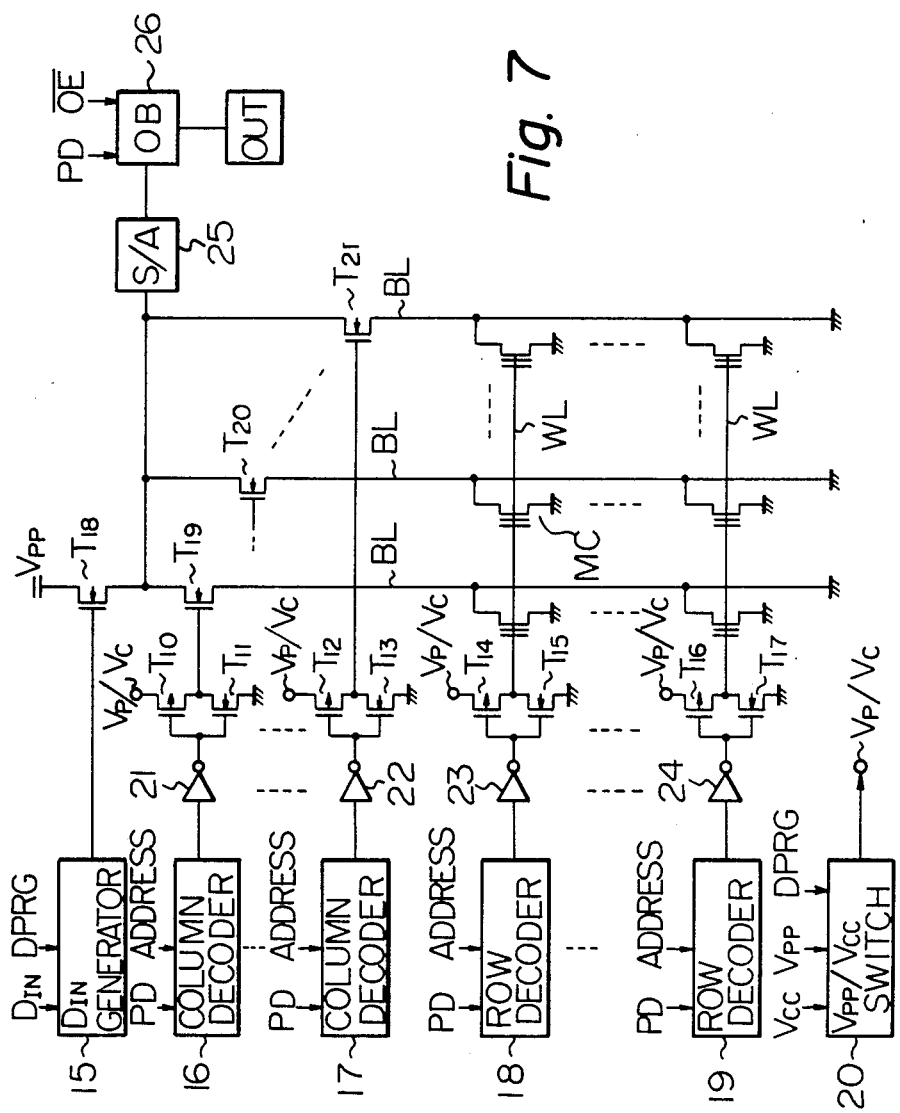

The circuit diagram of the EPROM is illustrated in FIGS. 6 and 7. FIG. 6 is a block diagram of a portion of the EPROM for generating an inner signal DPRG determining the program mode. In FIG. 6, 10 indicates a $\overline{CE}$ signal generator circuit, 11 indicates a $\overline{PGM}$ signal generator circuit, 12 indicates a $V_{PP}$ level detector circuit, 13 indicates an NOR gate circuit, and 14 indicates an inverter circuit. FIG. 7 is a circuit diagram of other portions of the EPROM. In FIG. 7, 15 indicates a data input ($D_{IN}$) signal generator circuit, 16 and 17 indicate column decoder circuits, 18 and 19 indicate row decoder circuits, 20 indicates a $V_{PP}/V_{CC}$ switch circuit, 21, 22, 23, and 24 indicate inverter circuits, 25 indicates a sense amplifier circuit, 26 indicates an output buffer circuit, $T_{10}$ through $T_{21}$ indicate transistors, WL indicates a word line, BL indicates a bit line, MC indicates a memory cell, OUT indicates an output terminal, PD indicates a power down signal, and $D_{IN}$ indicates a data input.

As seen from FIG. 6, the inner signal DPRG has a "high" level only when the signal $\overline{CE}$ is at a "low" level, the signal $\overline{PGM}$ is at a "low" level, and the variable voltage supply $V_{PP}$ is at a high level (21 V). When the inner signal DPRG has a "high" level, the output $V_P/V_C$ of the $V_{PP}/V_{CC}$ switch circuit 20 has the high level (21 V) of the variable voltage supply $V_{PP}$, and the output $V_P/V_C$ is applied to the word line WL and the bit line BL through the transistors $T_{14}$, - - - , $T_{16}$, $T_{10}$, - - - , $T_{12}$. Thus, an electric charge is injected into the floating gate of the memory cell, and the data input $D_{IN}$ is written into the memory cell.

According to the present invention, there can be provided a voltage supply level detecting circuit with a simple structure which can detect whether the variable voltage supply is at a high or low level.

We claim:
1. A voltage supply level detecting circuit, comprising:

a first voltage supply terminal for receiving a fixed voltage level;

a second voltage supply terminal for receiving a variable voltage level having a first voltage level higher than the fixed voltage level and a second voltage level lower than the first voltage level;

a ground terminal;

a first MIS transistor of a first conductivity type, operatively connected to said second voltage supply terminal, having a gate operatively connected to said first voltage supply terminal and having a threshold voltage;

a second MIS transistor of a second conductivity type, operatively connected to said ground terminal and said first MIS transistor and having a gate operatively connected to the gate of said first MIS transistor and said first voltage supply terminal, said first and second MIS transistors having a first junction therebetween;

a third MIS transistor of the first conductivity type, operatively connected to said first voltage supply terminal and having a gate operatively connected to said first junction;

a fourth MIS transistor of the second conductivity type, operatively connected to said ground terminal and said third MIS transistor and having a gate operatively connected to the gate of said third MIS transistor and the first junction, said third and fourth MIS transistors having a second junction therebetween;

level shift means, operatively connected between said second voltage supply terminal and said first MIS transistor, for providing said first MIS transistor with a third voltage level higher than the fixed voltage level plus the threshold voltage of said first MIS transistor when the first voltage level is applied to said second voltage supply terminal and for providing said first MIS transistor with a fourth voltage level lower than the fixed voltage level when said second voltage level is applied, said first and second MIS transistors and said level shift means having conductances such that the first junction provides a fifth voltage level higher than the fixed voltage level when the first voltage level is applied to the second voltage supply terminal, thereby turning OFF said third MIS transistor; and an output terminal, operatively connected to the second junction, for outputting a signal indicating whether the first voltage level or the second voltage level is received by said second voltage supply terminal.

2. A voltage supply level detecting circuit, comprising:

a first voltage supply terminal for receiving a fixed voltage level;

a second voltage supply terminal for receiving a variable voltage level having a first voltage leve or a second voltage level lower than said first voltage level;

a ground terminal;

a group of MIS transistors, connected in series, each having a gate and a drain connected together, operatively connected to said second voltage supply terminal;

a first MIS transistor of a first conductivity type, operatively connected to said group of MIS transistors and having a gate operatively connected to said first voltage supply terminal;

a second MIS transistor of a second conductivity type, operatively connected to said ground terminal and said first MIS transistor, creating a junction of said first and second MIS transistors, and having a gate operatively connected to said first voltage supply terminal; and an output terminal, operatively connected to the junction of said first and second MIS transistors, for outputting a signal indicating whether said first voltage level or said second voltage level is being received by said second voltage supply terminal.

3. A voltage supply level detecting circuit as defined in claim 2, further comprising:

a third MIS transistor of the first conductivity type, operatively connected to said first voltage supply terminal and having a gate operatively connected to the junction of said first and second MIS transistors; and a fourth MIS transistor of the second conductivity type, operatively connected to said ground terminal, and said third MIS transistor, creating a junction of said third and fourth MIS transistors which is operatively connected to said output terminal, and having a gate operatively connected to the junction of said first and second MIS transistors.

4. A voltage supply level detecting circuit, receiving a fixed voltage having a level and a variable voltage having a first voltage level substantially equal to the level of the fixed voltage and a second voltage level higher than the first voltage level by more than one volt, comprising:

a first MIS transistor of a first conductivity type, operatively connected to receive the variable voltage and having a gate operatively connected to receive the fixed voltage;

a second MIS transistor of a second conductivity type, operatively connected to ground and said first MIS transistor, creating a junction of said first and second MIS transistors, and having a gate operatively connected to receive the fixed voltage, the junction of said first and second MIS transistors supplying an intermediate signal having a third voltage level indicating that the variable voltage has the first voltage level and a fourth voltage level indicating that the variable voltage has the second voltage level;

a third MIS transistor of the first conductivity type, operatively connected to receive the fixed voltage and having a gate operatively connected to the junction of said first and second MIS transistors, said third MIS transistor being turned fully ON in response to the intermediate signal having the third voltage and being turned fully OFF in response to the intermediate signal having the fourth voltage level; and a fourth MIS transistor of the second conductivity type operatively connected to ground and said third MIS transistor, creating a junction of said third and fourth MIS transistors, and having a gate operatively connected to the junction of said first and second MIS transistors, said fourth MIS transistor being turned fully OFF in response to the intermediate signal having the third voltage level and being turned fully ON in response to the intermediate signal having the fourth voltage level, the junction of said third and fourth transistors supplying an output signal thereby indicating whether the variable voltage has the first voltage level or the second voltage level.

5. A voltage supply level detecting circuit as set forth in claim 4, further comprising a group MIS transistors, connected in series, each having a gate and a drain connected together, operatively connected between said first MIS transistor and the variable voltage.

6. A voltage supply level detecting circuit, comprising:
a first voltage supply terminal for receiving a fixed voltage level;
a second voltage supply terminal for receiving a variable voltage level having a first voltage level higher than the fixed voltage level and a second voltage level lower than the first voltage level;
a ground terminal;
a first MIS transistor of a first conductivity type, operatively connected to said second voltage supply terminal, having a gate operatively connected to said first voltage supply terminal and having a threshold voltage;
a secnd MIS transistor of a second conductivity type, operatively connected to said ground terminal and said first MIS transistor and having a gate operatively connected to the gate of said first MIS transistor and said first voltage supply terminal, and said first and second MIS transistors having a first junction therebetween;
a third MIS transistor of the first conductivity type, operatively connected to said first voltage supply terminal and having a gate operatively connected to said first junction;
a fourth MIS transistor of the second conductivity type, operatively connected to said ground terminal and said MIS transistor and having a gate operatively connected to the gate of said third MIS transistor and the first junction, said third and fourth MIS transistors having a second junction therebetween;
level shift means, operatively connected between said second voltage supply terminal and said first MIS transistor, for providing said first MIS transistor with a third voltage level higher than the fixed voltage level plus the threshold voltage of said first MIS transistor when the first voltage level is applied to said second voltage supply terminal and for providing said first MIS transistor with a fourth voltage level lower than the fixed voltage level when said second voltage level is applied, whereby said first MIS transistor is turned fully ON when the first voltage level is applied to said second voltage supply terminal and said first MIS transistor is turned fully OFF when the second voltage level is applied to said second voltage supply terminal; and
an output terminal, operatively connected to the second junction, for outputting a signal indicating whether the first voltage level or the second voltage level is received by said second voltage supply terminal.

* * * * *